(12) United States Patent
Huang et al.

(10) Patent No.: US 9,299,600 B2
(45) Date of Patent: Mar. 29, 2016

(54) METHOD FOR REPAIRING AN OXIDE LAYER AND METHOD FOR MANUFACTURING A SEMICONDUCTOR STRUCTURE APPLYING THE SAME

(71) Applicant: UNITED MICROELECTRONICS CORP., Hsinchu (TW)

(72) Inventors: Po-Cheng Huang, Kaohsiung (TW); Yu-Ting Li, Chiayi (TW); Chih-Hsun Lin, Pingtung County (TW); Kun-Ju Li, Tainan (TW); Wu-Sian Sie, Tainan (TW); Yi-Liang Liu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 8 days.

(21) Appl. No.: 14/444,131

(22) Filed: Jul. 28, 2014

(65) Prior Publication Data

US 2016/0027679 A1    Jan. 28, 2016

(51) Int. Cl.
*H01L 21/762* (2006.01)
*H01L 21/683* (2006.01)
*H01L 21/02* (2006.01)
*H01L 21/3105* (2006.01)
*H01L 21/311* (2006.01)

(52) U.S. Cl.
CPC .... *H01L 21/76224* (2013.01); *H01L 21/02227* (2013.01); *H01L 21/02318* (2013.01); *H01L 21/02348* (2013.01); *H01L 21/31053* (2013.01); *H01L 21/31111* (2013.01); *H01L 21/6835* (2013.01); *H01L 21/762* (2013.01); *H01L 21/76251* (2013.01); *H01L 2221/68363* (2013.01); *H01L 2221/68377* (2013.01); *H01L 2221/68381* (2013.01)

(58) Field of Classification Search
CPC .................... H01L 21/76224; H01L 21/2007; H01L 21/76251–21/76259; H01L 21/76264–21/76283
See application file for complete search history.

(56) References Cited

U.S. PATENT DOCUMENTS

| | | | |
|---|---|---|---|
| 7,781,306 B2* | 8/2010 | Kakehata | H01L 27/112 257/E21.088 |
| 8,268,705 B2 | 9/2012 | Yoshida et al. | |
| 2008/0102603 A1* | 5/2008 | Kobayashi | H01L 21/2007 438/459 |
| 2008/0185669 A1* | 8/2008 | Kok | H04R 19/005 257/416 |
| 2012/0045883 A1* | 2/2012 | Komatsu | H01L 21/76254 438/458 |
| 2012/0119224 A1* | 5/2012 | Tai | H01L 21/02002 257/77 |

\* cited by examiner

*Primary Examiner* — Alexander Sofocleous
*Assistant Examiner* — Sun M Kim
(74) *Attorney, Agent, or Firm* — WPAT, PC; Justin King (57) ABSTRACT

A method for repairing an oxide layer and a method for manufacturing a semiconductor structure applying the same are provided. The method for repairing an oxide layer comprises following steps. First, a carrier having a first area and a second area is provided, wherein a repairing oxide layer is formed on the second area. Then, the carrier is attached to a substrate with an oxide layer to be repaired formed thereon, wherein the carrier and the substrate are attached to each other through the repairing oxide layer and the oxide layer to be repaired. Thereafter, the oxide layer to be repaired is bonded with the repairing oxide layer.

16 Claims, 10 Drawing Sheets

METHOD FOR REPAIRING AN OXIDE LAYER AND METHOD FOR MANUFACTURING A SEMICONDUCTOR STRUCTURE APPLYING THE SAME

BACKGROUND

1. Technical Field

The disclosure relates to a method for manufacturing a semiconductor structure. More particularly, the disclosure relates to a method for repairing an oxide layer and a method for manufacturing a semiconductor structure applying the same.

2. Description of the Related Art

Semiconductor devices have been developed obeying Moore's Law, i.e., doubling the capacity of integrated circuits about every two year. However, as the semiconductor devices become smaller and smaller, this becomes very hard because problems such as subthreshold leakage will be more critical as the shrinkage of the devices. One approach to solve the problems is FinFET technology. In a FinFET, a plurality of "fins" are formed. Each fin comprises a source and a drain, and is surrounded by a gate. By such a structure, the gate can control the transistor more efficiently.

A semiconductor device applying the FinFET technology typically comprises densely formed features, such as the fins, and loosely formed features, such as those formed in the peripheral region. However, the deposition rate, etching rate, or the like, may not be the same in the region of densely formed features (hereinafter dense region) and in the region of loosely formed features (hereinafter loose region). As such, defects may be formed in the structure.

SUMMARY

In this disclosure, a method for repairing the defect formed in an oxide layer and a method for manufacturing a semiconductor structure applying the same are provided.

According to some embodiment, the method for repairing an oxide layer comprises following steps. First, a carrier having a first area and a second area is provided, wherein a repairing oxide layer is formed on the second area. Then, the carrier is attached to a substrate with an oxide layer to be repaired formed thereon, wherein the carrier and the substrate are attached to each other through the repairing oxide layer and the oxide layer to be repaired. Thereafter, the oxide layer to be repaired is bonded with the repairing oxide layer.

According to some embodiment, the method for manufacturing a semiconductor structure comprises following steps. First, a substrate having a first region and a second region is provided, wherein a plurality of fins are formed in the first region. An oxide layer is deposited in the first region and the second region of the substrate. Then, the oxide layer is polished. A carrier having a first area and a second area is provided, wherein a repairing oxide layer is formed on the second area. Then, the carrier is attached to the substrate, wherein the carrier and the substrate are attached to each other through the repairing oxide layer and the polished oxide layer in the second region. Thereafter, the polished oxide layer in the second region is bonded with the repairing oxide layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIGS. 1A-1G schematically show some steps of an exemplary method for manufacturing a semiconductor structure.

Figure 1A:
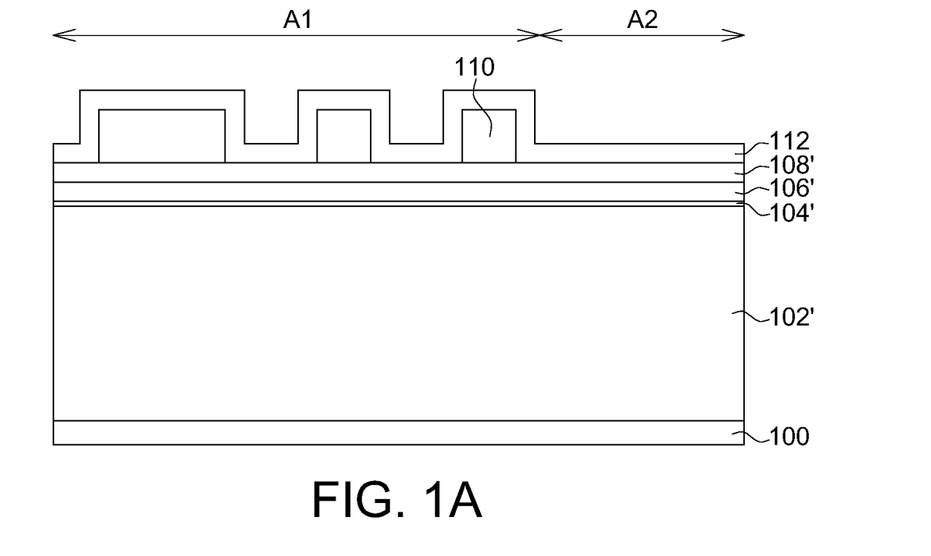
FIGS. 1A-1G schematically show some steps of an exemplary method for manufacturing a semiconductor structure.

Referring to FIG. 1A, a substrate 100 is provided. The substrate 100 has a first region A1 and a second region A2. A silicon layer 102 is formed on the substrate 100. Alternatively, the silicon layer 102' is part of the substrate 100. An oxide layer 104', a silicon nitride layer 106' and an in situ steam generation (ISSG) oxide layer 108' are sequentially formed on the silicon layer 102'. A plurality of mandrels 110 are formed in the first region A1. The mandrels 110 may be formed of silicon nitride, silicon oxide, poly-Si, organic material, amorphous carbon, ARC material, inorganic material, and the like. A spacer material 112 is formed covering the mandrels 110. The spacer material 112 may be silicon oxide, silicon nitride, silicon oxynitride, or the like.

Figure 1B:
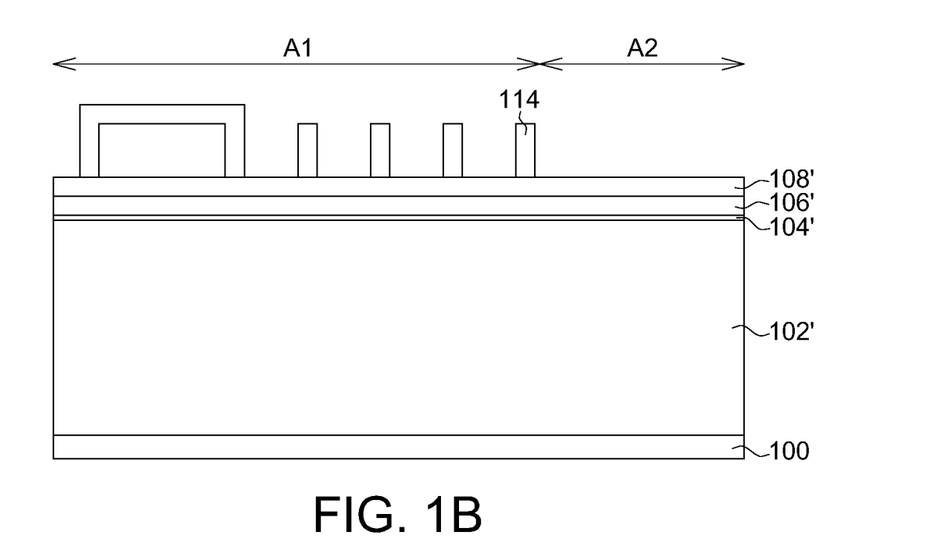
Figure 1C:
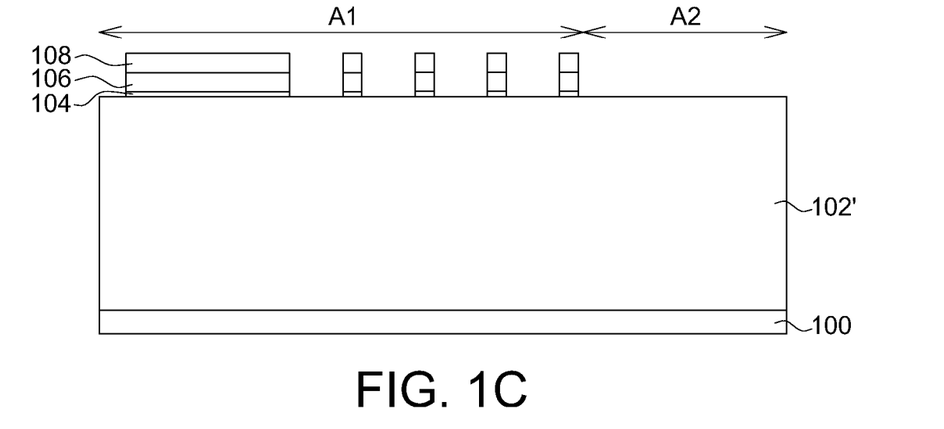
Figure 1D:
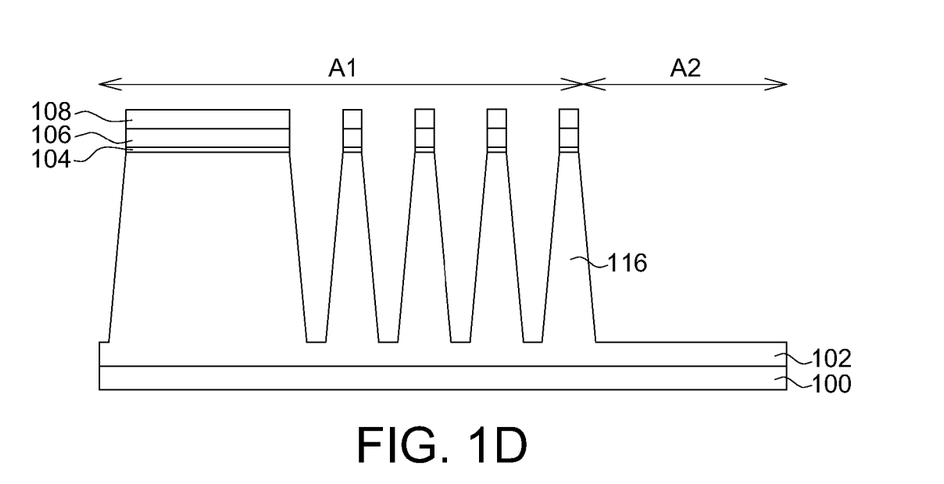
Figure 1E:
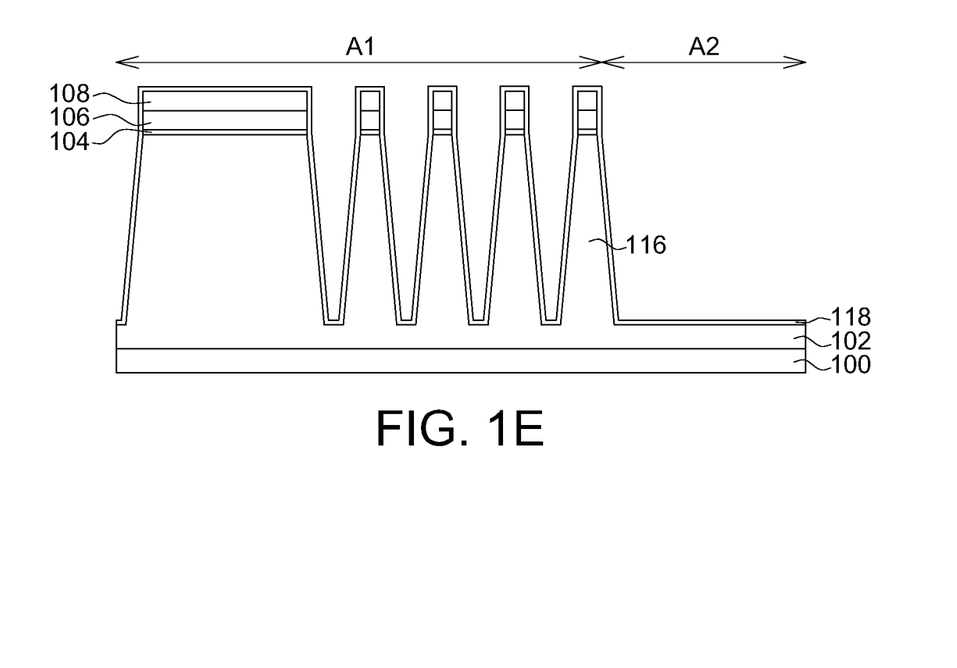

Referring to FIG. 1B, parts of the mandrels 110 and the spacer material 112 formed thereon are removed, thereby a plurality of spacers 114 are formed in the first region A1. Then, as shown in FIG. 1C, the pattern of the spacers 114 and the remaining parts of the mandrels 110 and the spacer material 112 covered thereon are transferred to the oxide layer 108', the silicon nitride layer 106' and the oxide layer 104', and pad oxides 104, pad silicon nitrides 106 and ISSG oxides 108 are formed. Thereafter, as shown in FIG. 1D, the pattern is further transfer to the silicon layer 102'. As such, a plurality of fins 116 are formed in the first region A1. In the second region A2, while only the remaining silicon layer 102 is shown, features and/or devices may be formed thereon. A buffering film 118, such as a SBF, is then formed conformally covering the ISSG oxides 108, the pad silicon nitrides 106, the pad oxides 104 and the fins 116, as shown in FIG. 1E.

Figure 1F:
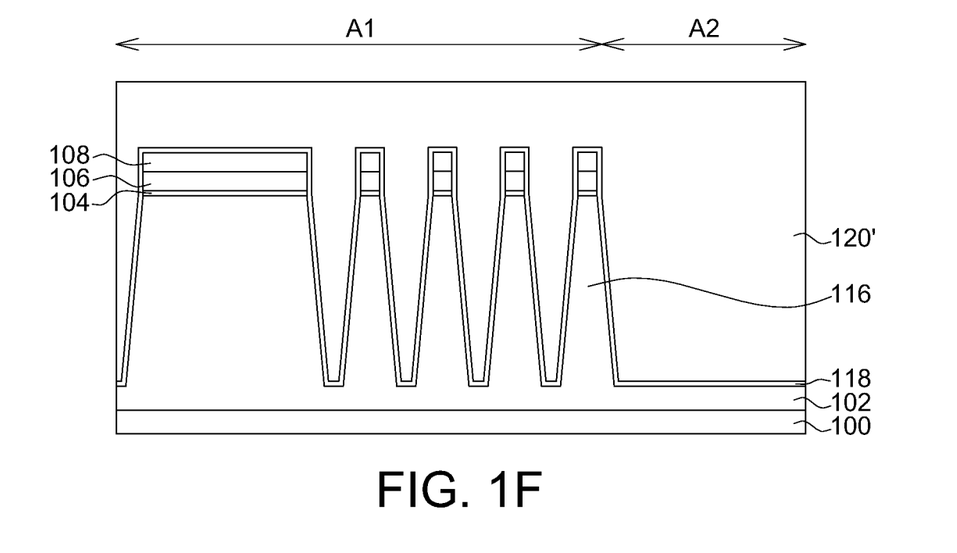
Figure 1G:
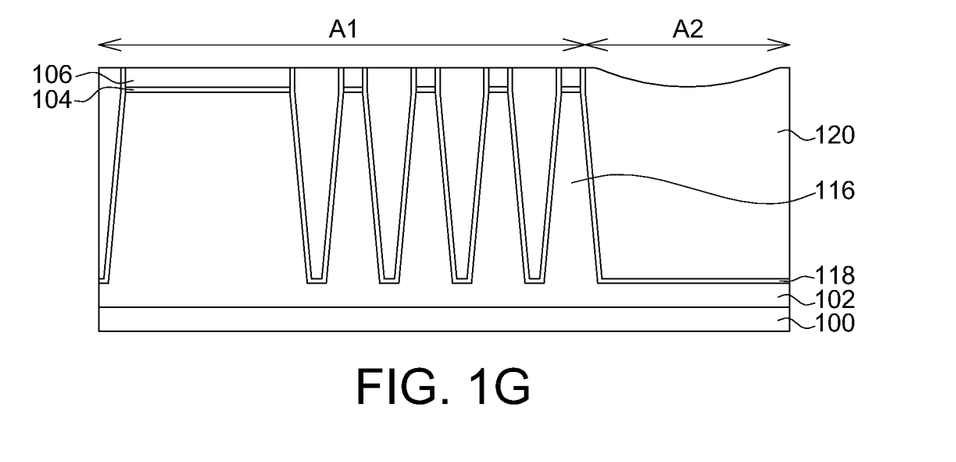

Referring to FIG. 1F, an oxide layer 120' is deposited in the first region A1 and the second region A2 of the substrate 100. In some example, the oxide layer 120' is deposited for the filling of shallow trench isolation (STI). The oxide layer 120' may be deposited by flowable chemical vapor deposition (FCVD), and an anneal process may be carried out. Then, the oxide layer 120' is polished. Here, the silicon nitrides 106 are used as the stop layer. As shown in FIG. 1G, in most cases, due to the polishing rate difference between the dense region (i.e., the first region) and the loose region (i.e., the second region), the polished oxide layer 120 will have dishes in the loose region.

FIGS. 2A-2E schematically show a method for repairing the oxide layer according to one embodiment.

Figure 2A:
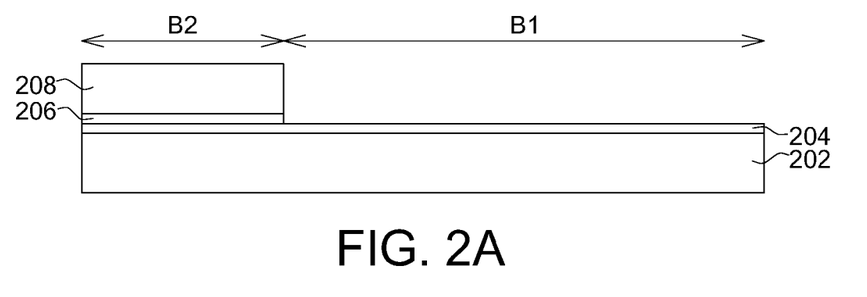
FIGS. 2A-2E schematically show a method for repairing an oxide layer according to one embodiment.

Referring to FIG. 2A, a carrier 202 having a first area B1 and a second area B2 is provided. An inactive film 204 is formed on at least the first area B1 of the carrier 202, and a separating film 206 is formed on the second area B2 of the carrier 202. In this embodiment, the inactive film 204 is formed on both the first area B1 and the second area B2 of the carrier 202, and the separating film 206 is formed on the inactive film 204. A repairing oxide layer 208 is formed on the second area B2. More specifically, the repairing oxide layer 208 is formed on the separating film 206.

The inactive film 204, after annealing, is inactive to the oxide layer to be repaired, so as to prevent the reaction with the oxide layer to be repaired. The separating film 206 can be easily separated from the repairing oxide layer 208 after treatment such as UV treatment, thermal treatment, etching, or the like. In some example, the inactive film 204 may be formed of SiN or SiCN, and the separating film 206 may be formed of SiN, SiCN or Si. For instance, the inactive film 204 and the separating film 206 may be formed of SiN having different etching rates. In this case, the separating film 206 may be firstly formed on the whole carrier 202, and then the parts formed in the second area B2 is removed by etching. The repairing oxide layer 208 may be formed by FCVD.

Figure 2B:
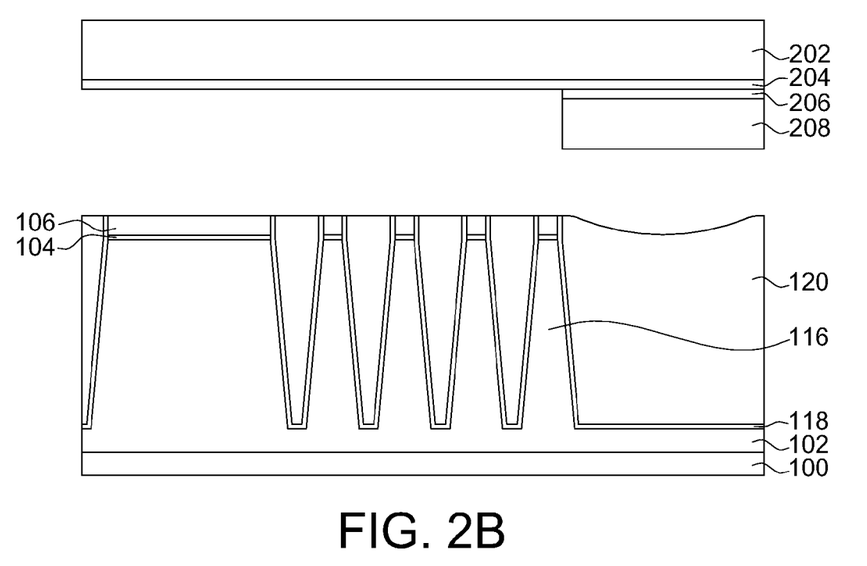

Referring to FIG. 2B, the carrier 202 is attached to the substrate 100. More specifically, the carrier 202 and the substrate 100 are attached to each other through the repairing oxide layer 208 and the oxide layer to be repaired, i.e., the polished oxide layer 120 in the second region A2.

Figure 2C:
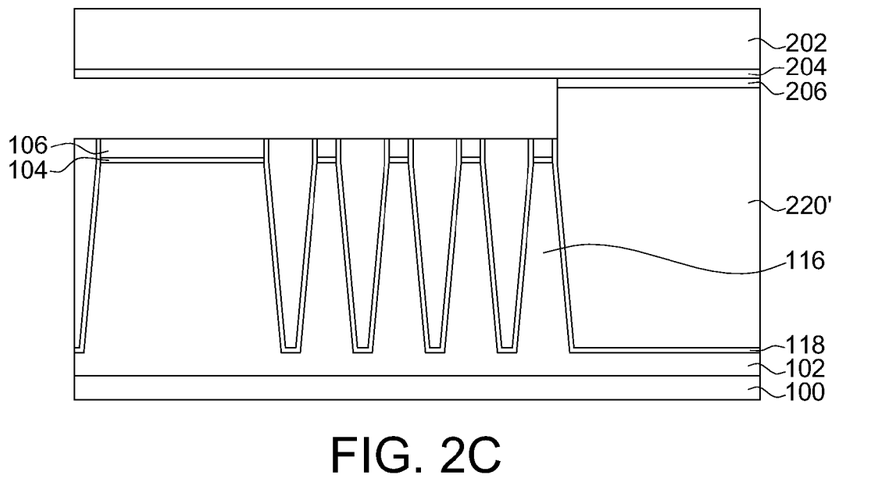

Referring to FIG. 2C, the polished oxide layer 120 in the second region A2 is bonded with the repairing oxide layer 208. The polished oxide layer 120 in the second region A2 and the repairing oxide layer 208 form a bulk oxide 220'. In some example, the polished oxide layer 120 in the second region A2 may be bonded with the repairing oxide layer 208 by thermal curing at a temperature such as higher than 700° C. Further, an $O_3$ gas may be provided when bonding the polished oxide layer 120 in the second region A2 with the repairing oxide layer 208. The oxide layer 120 is thus repaired.

Figure 2D:
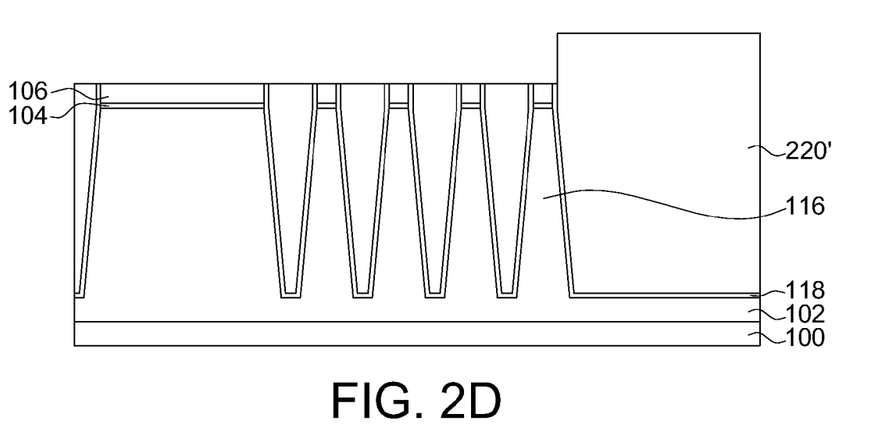
Figure 2E:
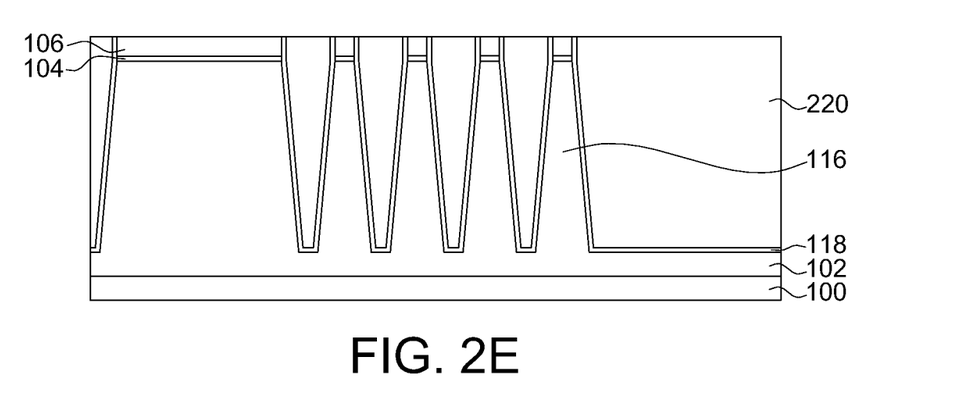

Referring to FIG. 2D, the repairing oxide layer 208 is separated from the separating film 206. More specifically, the repairing oxide layer 208 may be separated from the separating film 206 by UV light, heat, etching, or the like. The method may further comprise a step of polishing the bulk oxide 220'. As shown in FIG. 2E, the repaired oxide layer 220, unlike the oxide layer 120, has no dishing in it.

FIGS. 3A-3E schematically show a method for repairing the oxide layer according to another embodiment.

Figure 3A:
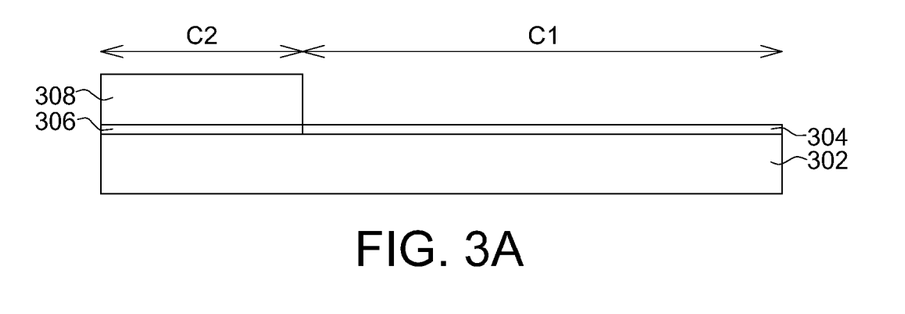
FIGS. 3A-3E schematically show a method for repairing an oxide layer according to another embodiment.

Referring to FIG. 3A, a carrier 302 having a first area C1 and a second area C2 is provided. In this embodiment, the inactive film 304 is formed only on the first area C1 of the carrier 302, and the separating film 306 is formed on the second area C2 of the carrier 302. A repairing oxide layer 308 is formed on the second area C2. More specifically, the repairing oxide layer 308 is formed on the separating film 306.

The inactive film 304, after annealing, is inactive to the oxide layer to be repaired, so as to prevent the reaction with the oxide layer to be repaired. The separating film 306 can be easily separated from the repairing oxide layer 308 after treatment such as UV treatment, thermal treatment, etching, or the like. In some example, the inactive film 304 may be formed of SiN or SiCN, and the separating film 306 may be formed of SiN, SiCN or Si. The repairing oxide layer 308 may be formed by FCVD.

Figure 3B:
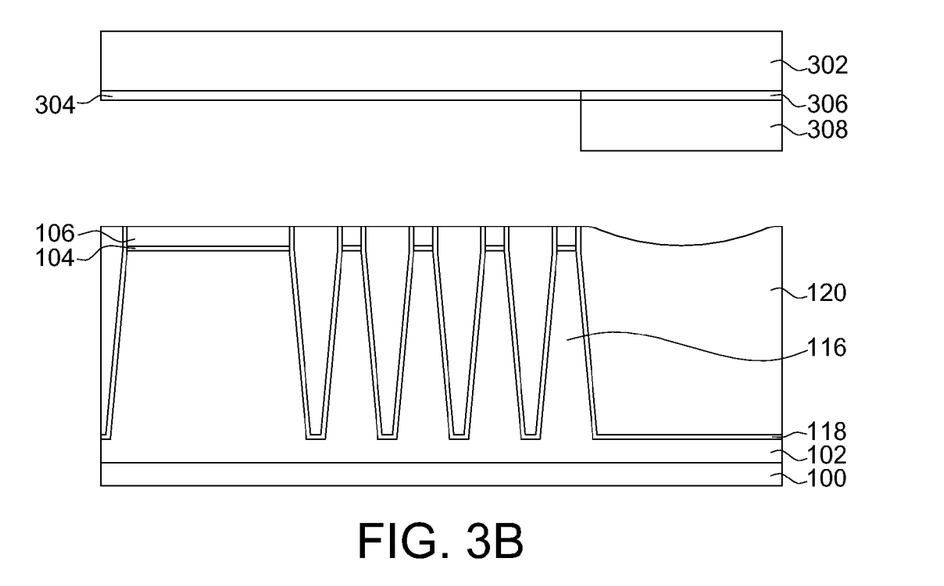

Referring to FIG. 3B, the carrier 302 is attached to the substrate 100. More specifically, the carrier 302 and the substrate 100 are attached to each other through the repairing oxide layer 308 and the oxide layer to be repaired, i.e., the polished oxide layer 120 in the second region A2.

Figure 3C:
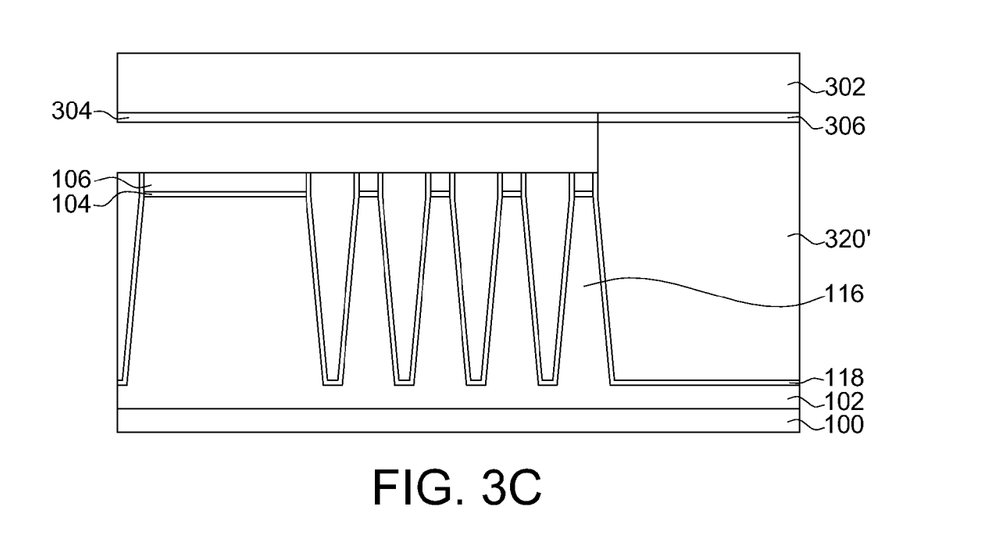

Referring to FIG. 3C, the polished oxide layer 120 in the second region A2 is bonded with the repairing oxide layer 308. The polished oxide layer 120 in the second region A2 and the repairing oxide layer 308 form a bulk oxide 320'. In some example, the polished oxide layer 120 in the second region A2 may be bonded with the repairing oxide layer 308 by thermal curing at a temperature such as higher than 700° C. Further, an $O_3$ gas may be provided when bonding the polished oxide layer 120 in the second region A2 with the repairing oxide layer 308. The oxide layer 120 is thus repaired.

Figure 3D:
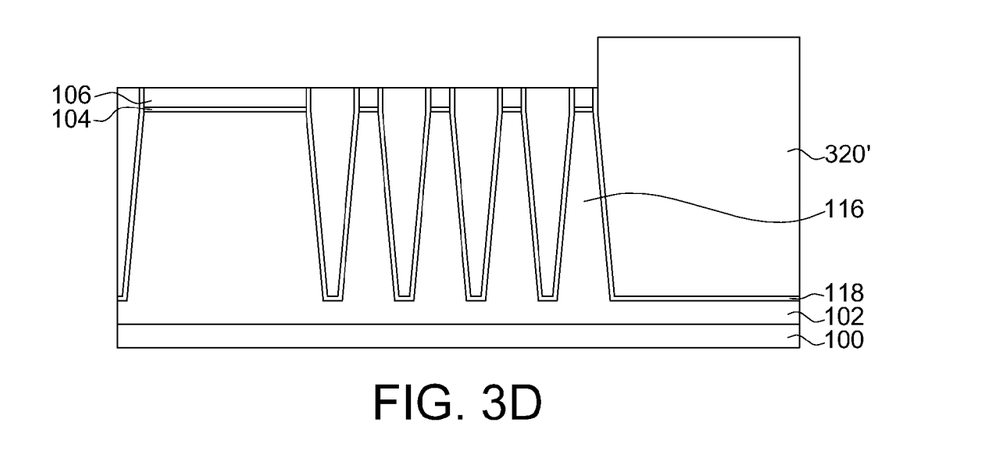
Figure 3E:
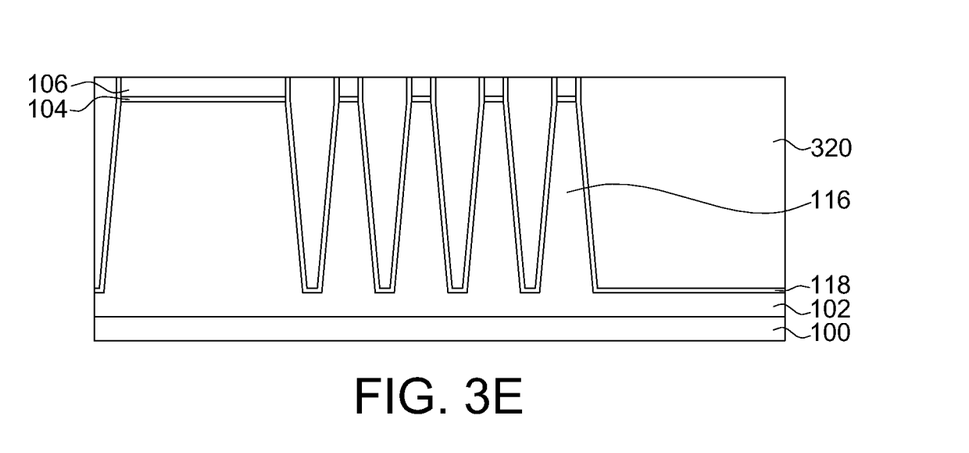

Referring to FIG. 3D, the repairing oxide layer 308 is separated from the separating film 306. More specifically, the repairing oxide layer 308 may be separated from the separating film 306 by UV light, heat, etching, or the like. The method may further comprise a step of polishing the bulk oxide 320'. As shown in FIG. 3E, the repaired oxide layer 320, unlike the oxide layer 120, has no dishing in it.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for repairing an oxide layer, comprising:
   providing a carrier having a first area and a second area, wherein a separating film is formed on the second area, a repairing oxide layer is formed on the second area, and the repairing oxide layer is formed on the separating film;
   attaching the carrier to a substrate with an oxide layer to be repaired formed thereon, wherein the carrier and the substrate are attached to each other through the repairing oxide layer and the oxide layer to be repaired;
   bonding the oxide layer to be repaired with the repairing oxide layer, wherein the oxide layer to be repaired and the repairing oxide layer form a bulk oxide;
   separating the repairing oxide layer from the separating film; and
   polishing the bulk oxide.

2. The method according to claim 1, wherein an inactive film is formed on at least the first area of the carrier.

3. The method according to claim 2, wherein the inactive film is formed only on the first area of the carrier.

4. The method according to claim 2, wherein the inactive film is formed on both the first area and the second area of the carrier, and the separating film is formed on the inactive film.

5. The method according to claim 2, wherein the inactive film is formed of SiN or SiCN, and the separating film is formed of SiN, SiCN or Si.

6. The method according to claim 1, wherein the oxide layer to be repaired is bonded with the repairing oxide layer by thermal curing at a temperature higher than 700° C.

7. The method according to claim 6, an $O_3$ gas is provided when bonding the oxide layer to be repaired with the repairing oxide layer.

8. The method according to claim 1, wherein the repairing oxide layer is separated from the separating film by UV light, heat or etching.

9. A method for manufacturing a semiconductor structure, comprising:
   providing a substrate having a first region and a second region, wherein a plurality of fins are formed in the first region;
   depositing an oxide layer in the first region and the second region of the substrate;
   polishing the oxide layer;
   providing a carrier having a first area and a second area, wherein a separating film is formed on the second area, a repairing oxide layer is formed on the second area, and the repairing oxide layer is formed on the separating film;

attaching the carrier to the substrate, wherein the carrier and the substrate are attached to each other through the repairing oxide layer and the polished oxide layer in the second region;

bonding the polished oxide layer in the second region with the repairing oxide layer, wherein the polished oxide layer in the second region and the repairing oxide layer form a bulk oxide;

separating the repairing oxide layer from the separating film; and polishing the bulk oxide.

10. The method according to claim 9, wherein an inactive film is formed on at least the first area of the carrier.

11. The method according to claim 10, wherein the inactive film is formed only on the first area of the carrier.

12. The method according to claim 10, wherein the inactive film is formed on both the first area and the second area of the carrier, and the separating film is formed on the inactive film.

13. The method according to claim 10, wherein the inactive film is formed of SiN or SiCN, and the separating film is formed of SiN, SiCN or Si.

14. The method according to claim 9, wherein the polished oxide layer in the second region is bonded with the repairing oxide layer by thermal curing at a temperature higher than 700° C.

15. The method according to claim 14, an $O_3$ gas is provided when bonding the polished oxide layer in the second region with the repairing oxide layer.

16. The method according to claim 9, wherein the repairing oxide layer is separated from the separating film by UV light, heat or etching.

* * * * *